United States Patent
Comiskey et al.

(10) Patent No.: US 6,177,921 B1
(45) Date of Patent: Jan. 23, 2001

(54) PRINTABLE ELECTRODE STRUCTURES FOR DISPLAYS

(75) Inventors: Barrett Comiskey, Cambridge; Paul Drzaic, Lexington, both of MA (US)

(73) Assignee: E Ink Corporation, Cambridge, MA (US)

( * ) Notice: Under 35 U.S.C. 154(b), the term of this patent shall be extended for 0 days.

(21) Appl. No.: 09/141,103

(22) Filed: Aug. 27, 1998

Related U.S. Application Data

(60) Provisional application No. 60/057,133, filed on Aug. 28, 1997, provisional application No. 60/057,716, filed on Aug. 28, 1997, provisional application No. 60/057,122, filed on Aug. 28, 1997, provisional application No. 60/057,798, filed on Aug. 28, 1997, provisional application No. 60/057,163, filed on Aug. 28, 1997, provisional application No. 60/059,358, filed on Sep. 19, 1997, provisional application No. 60/065,630, filed on Nov. 18, 1997, provisional application No. 60/066,245, filed on Nov. 20, 1997, provisional application No. 60/066,246, filed on Nov. 20, 1997, provisional application No. 60/066,115, filed on Nov. 21, 1997, provisional application No. 60/066,334, filed on Nov. 21, 1997, provisional application No. 60/066,418, filed on Nov. 24, 1997, provisional application No. 60/070,940, filed on Jan. 9, 1998, provisional application No. 60/071,371, filed on Jan. 15, 1998, provisional application No. 60/072,390, filed on Jan. 9, 1998, provisional application No. 60/070,939, filed on Jan. 9, 1998, provisional application No. 60/070,935, filed on Jan. 9, 1998, provisional application No. 60/074,454, filed on Feb. 12, 1998, provisional application No. 60/076,955, filed on Mar. 5, 1998, provisional application No. 60/076,959, filed on Mar. 5, 1998, provisional application No. 60/076,957, filed on Mar. 5, 1998, provisional application No. 60/076,956, filed on Mar. 5, 1998, provisional application No. 60/076,978, filed on Mar. 5, 1998, provisional application No. 60/078,363, filed on Mar. 18, 1998, provisional application No. 60/081,374, filed on Apr. 10, 1998, provisional application No. 60/081,362, filed on Apr. 10, 1998, provisional application No. 60/085,096, filed on May 12, 1998, provisional application No. 60/090,222, filed on Jun. 22, 1998, provisional application No. 60/092,046, filed on Jul. 8, 1998, provisional application No. 60/092,050, filed on Jul. 8, 1998, and provisional application No. 60/092,742, filed on Jul. 14, 1998.

(51) Int. Cl.[7] .............................. G09G 3/34; G02B 26/00
(52) U.S. Cl. ...................... 345/107; 359/296; 359/297
(58) Field of Search ........................... 345/107; 359/296, 359/297

(56) References Cited

U.S. PATENT DOCUMENTS

| 3,806,893 | 4/1974 | Ohnishi et al. ..................... 340/173 |
| 3,850,627 | 11/1974 | Wells et al. ............................ 96/1.3 |

(List continued on next page.)

FOREIGN PATENT DOCUMENTS

| 4431441C1 | 2/1996 | (DE) ............................ H02J/13/00 |
| 19500694A1 | 8/1996 | (DE) ................................ G09F/9/33 |

(List continued on next page.)

OTHER PUBLICATIONS

W.S. Quon, "Multilevel Voltage Select (MLVS): A Novel Technique to X–Y Address an Electrophoretic Image Display" Trans. On Electron Devices ED24(8):1121–1123(1977).

(List continued on next page.)

Primary Examiner—Matthew Luu
Assistant Examiner—Anthony J Blackman
(74) Attorney, Agent, or Firm—Testa, Hurwitz & Thibeault, LLP

(57) ABSTRACT

Novel addressing schemes for controlling electronically addressable displays include a scheme for rear-addressing displays, which allows for in-plane switching of the display material. Other schemes include a rear-addressing scheme which uses a retroreflecting surface to enable greater viewing angle and contrast. Another scheme includes an electrode structure that facilitates manufacture and control of a color display. Another electrode structure facilitates addressing a display using an electrostatic stylus. Methods of using the disclosed electrode structures are also disclosed. Another scheme includes devices combining display materials with silicon transistor addressing structures.

15 Claims, 8 Drawing Sheets

U.S. PATENT DOCUMENTS

| | | |
|---|---|---|
| 3,892,568 | 7/1975 | Ota .................... 96/1.3 |
| 4,041,481 | 8/1977 | Sato .................... 340/324 |
| 4,045,327 | 8/1977 | Noma et al. .................... 204/299 |
| 4,068,927 | 1/1978 | White .................... 350/160 |
| 4,071,430 | 1/1978 | Liebert .................... 204/299 |
| 4,088,395 | 5/1978 | Giglia .................... 350/357 |
| 4,104,520 * | 8/1978 | Lewis et al. .................... 250/315 |
| 4,123,346 | 10/1978 | Ploix .................... 204/299 |
| 4,126,854 | 11/1978 | Sheridon .................... 340/373 |
| 4,149,149 | 4/1979 | Miki et al. .................... 340/753 |
| 4,203,106 | 5/1980 | Dalisa et al. .................... 340/787 |
| 4,218,302 | 8/1980 | Dalisa et al. .................... 204/299 |
| 4,305,807 | 12/1981 | Somlyody .................... 204/299 |
| 4,418,346 | 11/1983 | Batchelder .................... 340/787 |
| 4,430,648 | 2/1984 | Togashi et al. .................... 340/718 |
| 4,450,440 | 5/1984 | White .................... 340/753 |
| 4,522,472 | 6/1985 | Liebert et al. .................... 350/362 |
| 4,648,956 | 3/1987 | Marshall et al. .................... 204/299 |
| 4,655,897 * | 4/1987 | DiSanto et al. .................... 204/299 |
| 4,686,524 * | 8/1987 | White .................... 340/787 |
| 4,741,604 | 5/1988 | Kornfeld .................... 350/362 |
| 5,077,157 * | 12/1991 | DiSanto et al. .................... 430/20 |
| 5,105,185 | 4/1992 | Nakanowatari et al. .................... 340/784 |
| 5,174,882 * | 12/1992 | DiSanto et al. .................... 204/299 |
| 5,223,823 | 6/1993 | DiSanto et al. .................... 340/787 |
| 5,233,459 * | 8/1993 | Bozler et al. .................... 359/230 |
| 5,250,932 | 10/1993 | Yoshimoto et al. .................... 345/206 |
| 5,250,938 | 10/1993 | DiSanto et al. .................... 345/107 |
| 5,254,981 | 10/1993 | DiSanto et al. .................... 345/107 |
| 5,293,528 | 3/1994 | DiSanto et al. .................... 345/107 |
| 5,302,235 | 4/1994 | DiSanto et al. .................... 156/643 |
| 5,304,439 | 4/1994 | DiSanto et al. .................... 430/20 |
| 5,315,312 | 5/1994 | DiSanto et al. .................... 345/107 |
| 5,345,251 | 9/1994 | DiSanto et al. .................... 345/107 |
| 5,359,346 | 10/1994 | DiSanto et al. .................... 345/107 |
| 5,402,145 | 3/1995 | DiSanto et al. .................... 345/107 |
| 5,412,398 | 5/1995 | DiSanto et al. .................... 345/107 |
| 5,460,688 | 10/1995 | DiSanto et al. .................... 216/5 |
| 5,467,107 | 11/1995 | DiSanto et al. .................... 345/107 |
| 5,499,038 | 3/1996 | DiSanto et al. .................... 345/107 |
| 5,561,443 | 10/1996 | DiSanto et al. .................... 345/107 |
| 5,565,885 | 10/1996 | Tamanoi .................... 345/100 |
| 5,575,554 | 11/1996 | Guritz .................... 362/103 |
| 5,627,561 | 5/1997 | Laspina et al. .................... 345/107 |
| 5,650,199 * | 7/1997 | Chang et al. .................... 427/33 |
| 5,684,501 | 11/1997 | Knapp et al. .................... 345/94 |
| 5,689,282 | 11/1997 | Wolfs et al. .................... 345/100 |
| 5,717,515 | 2/1998 | Sheridon .................... 359/296 |
| 5,729,663 | 3/1998 | Lin et al. .................... 395/107 |
| 5,739,801 | 4/1998 | Sheridon .................... 345/84 |
| 5,786,875 | 7/1998 | Brader et al. .................... 349/20 |
| 5,930,026 * | 7/1999 | Jacobson et al. .................... 359/296 |
| 5,961,804 * | 10/1999 | Jacobson et al. .................... 204/606 |

FOREIGN PATENT DOCUMENTS

| | | | |
|---|---|---|---|
| 0186710A1 | 7/1986 | (EP) | G02F/1/133 |
| 0361420A2 | 4/1990 | (EP) | G02F/1/133 |
| 0404545A2 | 12/1990 | (EP) | G02F/1/136 |
| 0443571A2 | 8/1991 | (EP) | G02F/1/1333 |
| 0525852A1 | 2/1993 | (EP) | G09G/3/36 |
| 0684579A2 | 11/1995 | (EP) | G06K/11/12 |
| 2306229 | 4/1997 | (GB) | G02F/1/1335 |
| 55-096922 | 7/1980 | (JP) | G02F/1/133 |
| 62-058222 | 3/1987 | (JP) | G02F/1/133 |
| 01086116 | 3/1989 | (JP) | G02F/1/19 |
| 6089081 | 3/1994 | (JP) | G09G/3/36 |
| 07036020 | 2/1995 | (JP) | G02F/1/1333 |
| 9031453 | 2/1997 | (JP) | B01J/13/16 |
| 10149118 | 6/1998 | (JP) | G09F/9/37 |
| WO92/17873 | 10/1992 | (WO) | G09G/3/34 |
| WO92/20060 | 11/1992 | (WO) | G09G/3/34 |
| WO92/21733 | 12/1992 | (WO) | C09K/19/00 |
| WO93/02443 | 2/1993 | (WO) | G09G/3/34 |
| WO93/04458 | 3/1993 | (WO) | G09G/3/00 |
| WO93/04459 | 3/1993 | (WO) | G09G/3/34 |
| WO93/05425 | 3/1993 | (WO) | G02B/26/00 |
| WO93/07608 | 4/1993 | (WO) | G09G/3/34 |
| WO93/17414 | 9/1993 | (WO) | G09G/3/34 |
| WO95/06307 | 3/1995 | (WO) | G09G/3/00 |
| WO95/07527 | 3/1995 | (WO) | G09G/3/34 |
| WO95/10107 | 4/1995 | (WO) | G09G/3/34 |

OTHER PUBLICATIONS

A.L. Dalisa, "Electrophoretic Display Technology" *Trans. On Electron Devices* ED24(7):827–834 (1977).

B. Singer et al., "An X–Y Addressable Electrophoretic Display" *Proc. Of the SID* 18(3&4):255–266 (1977).

M. Saitoh et al., "A Newly Developed Electrical Twisting Ball Display" *Proc. of the SID* 23(4):249–251 (1982).

S.F. Blazo, "10.1/9:00A.M.: High Resolution Electrophoretic Display with Photoconductor Addressing" *SID 82 Digest*, pp 92–93 (1982).

N.K. Sheridon et al., "10.2/9:25 A.M.: A Photoconductor–Addressed Electrophoretic Cell for Office Data Display" *SID 82 Digest*, pp 94–95 (1982).

C. Kornfeld, "9.5: A Defect–Tolerant Active–Matrix Electrophoretic Display" *SID 84 Digest*, pp 142–144 (1984).

R.R. Shiffman et al., "An Electrophoretic Image Display with Internal NMOS Address Logic and Display Drivers" *Proc. of the SID* 25(2):105–115 (1984).

P. Murau, "9.4:Characteristics of an X–Y Addressed Electrophoretic Image Display (EPID)" *SID 84 Digest*, p 141 (1984).

S. Shiwa et al., "5.6: Electrophoretic Display Method Using Ionographic Technology" *SID 88 Digest*, pp 61–62 (1988).

N.A. Vaz et al., "Dual Frequency Addressing of Polymer–Dispersed Liquid–Crystal Films" *J. Appl. Phys.* 65(12):5043–5050 (1989).

M. Yamaguchi et al., "Equivalent Circuit of Ion Projection–Driven Electrophoretic Display" *IEICE Trans.* 74(12):4152–4156 (1991).

H. Hosaka et al., "Electromagnetic Microrelays: Concepts and Fundamental Characteristics" *Sensors and Actuators A* 40:41–47 (1994).

F.M. Moesner et al., "Devices for Particle Handling by an AC Electric Field" *1995 IEEE*, pp 66–71 (1995).

* cited by examiner

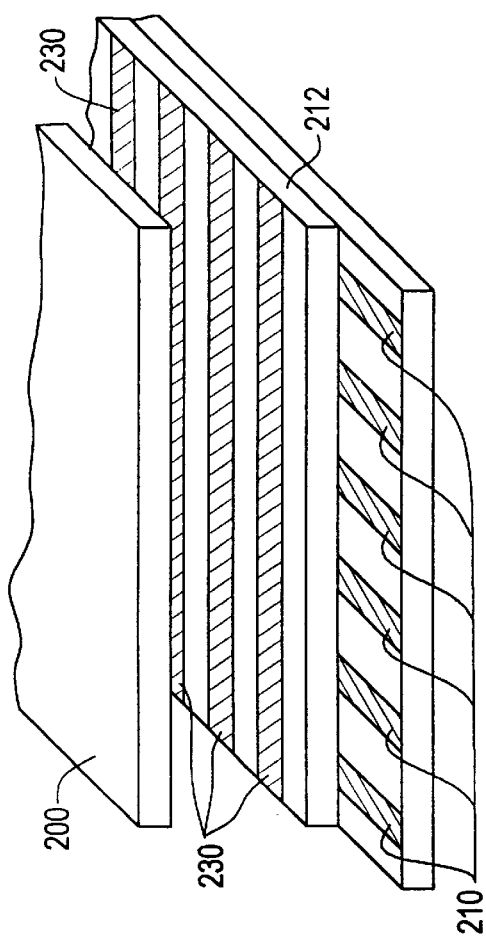
FIG. 12
FIG. 13
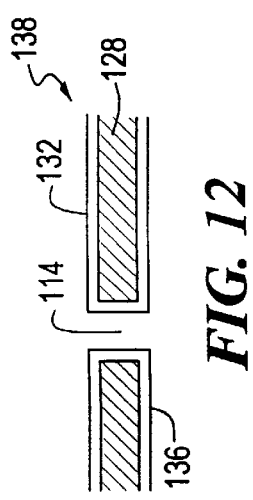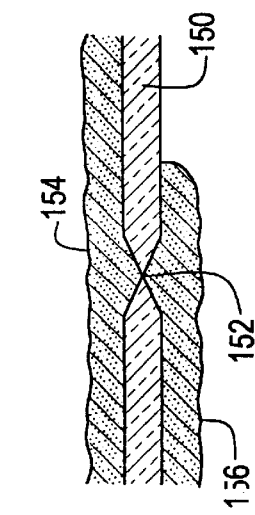
FIG. 14
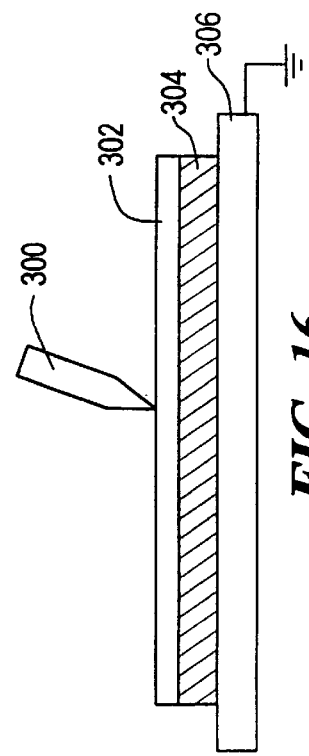
FIG. 15
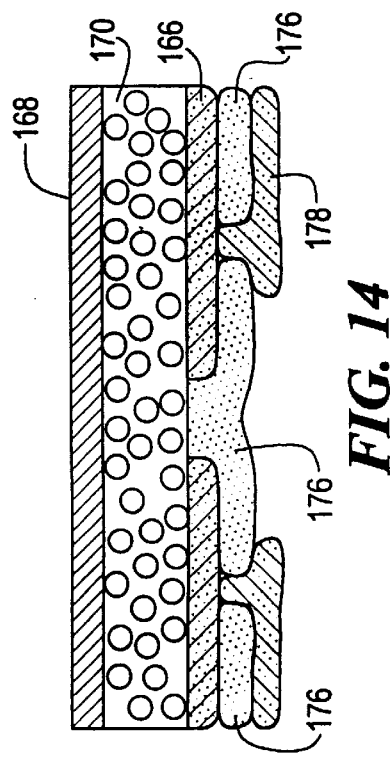
FIG. 16

PRINTABLE ELECTRODE STRUCTURES FOR DISPLAYS

CROSS-REFERENCE TO RELATED APPLICATIONS

This application incorporates herein by reference U.S. Ser. No. 08/504,896 filed Jul. 20, 1995, U.S. Ser. No. 08/983,404 filed Jul. 19, 1997, and U.S. Ser. No. 08/935,800 filed Sep. 23, 1997. This application claims priority to U.S. Ser. No. 60/057,133 filed Aug. 28, 1997, U.S. Ser. No. 60/057,716 filed Aug. 28, 1997, U.S. Ser. No. 60/057,122 filed Aug. 28, 1997, U.S. Ser. No. 60/057,798 filed Aug. 28, 1997, U.S. Ser. No. 60/057,163 filed Aug. 28, 1997, U.S. Ser. No. 60/059,358 filed Sep. 19, 1997, U.S. Ser. No. 60/065,630 filed Nov. 18, 1997, U.S. Ser. No. 60/066,245 filed Nov. 20, 1997, U.S. Ser. No. 60/066,246 filed Nov. 20, 1997, U.S. Ser. No. 60/066,115 filed Nov. 21, 1997, U.S. Ser. No. 60/066,334 filed Nov. 21, 1997, U.S. Ser. No. 60/066,418 filed Nov. 24, 1997, U.S. Ser. No. 60/070,940 filed Jan. 9, 1998, U.S. Ser. No. 60/071,371 filed Jan. 15, 1998, U.S. Ser. No. 60/072,390 filed Jan. 9, 1998, U.S. Ser. No. 60/070,939 filed Jan. 9, 1998, U.S. Ser. No. 60/070,935 filed Jan. 9, 1998, U.S. Ser. No. 60/074,454 filed Feb. 12, 1998, U.S. Ser. No. 60/076,955 filed Mar. 5, 1998, U.S. Ser. No. 60/076,959 filed Mar. 5, 1998, U.S. Ser. No. 60/076,957 filed Mar. 5, 1998, U.S. Ser. No. 60/076,956 filed Mar. 5, 1998, U.S. Ser. No. 60/076,978 filed Mar. 5, 1998, U.S. Ser. No. 60/078,363 filed Mar. 18, 1998, U.S. Ser. No. 60/081,374 filed Apr. 10, 1998, U.S. Ser. No. 60/081,362 filed Apr. 10, 1998, U.S. Ser. No. 60/085,096 filed May 12, 1998, U.S. Ser. No. 60/090,222 filed Jun. 22, 1998, U.S. Ser. No. 60/092,046 filed Jul. 8, 1998, U.S. Ser. No. 60/092,050 filed Jul. 8, 1998, and U.S. Ser. No. 60/092,742 filed Jul. 14, 1998, the contents of all of which are incorporated herein by reference.

FIELD OF THE INVENTION

The present invention relates to addressing apparatus and methods for electronic displays and, in particular, to addressing apparatus and methods for encapsulated electrophoretic displays.

BACKGROUND OF THE INVENTION

Traditionally, electronic displays such as liquid crystal displays have been made by sandwiching an optoelectrically active material between two pieces of glass. In many cases each piece of glass has an etched, clear electrode structure formed using indium tin oxide. A first electrode structure controls all the segments of the display that may be addressed, that is, changed from one visual state to another. A second electrode, sometimes called a counter electrode, addresses all display segments as one large electrode, and is generally designed not to overlap any of the rear electrode wire connections that are not desired in the final image. Alternatively, the second electrode is also patterned to control specific segments of the displays. In these displays, unaddressed areas of the display have a defined appearance.

Electrophoretic display media, generally characterized by the movement of particles through an applied electric field, are highly reflective, can be made bistable, and consume very little power. Encapsulated electrophoretic displays also enable the display to be printed. These properties allow encapsulated electrophoretic display media to be used in many applications for which traditional electronic displays are not suitable, such as flexible displays. The electro-optical properties of encapsulated displays allow, and in some cases require, novel schemes or configurations to be used to address the displays.

SUMMARY OF THE INVENTION

An object of the invention is to provide a highly-flexible, reflective display which can be manufactured easily, consumes little (or no in the case of bistable displays) power, and can, therefore, be incorporated into a variety of applications. The invention features a printable display comprising an encapsulated electrophoretic display medium. The resulting display is flexible. Since the display media can be printed, the display itself can be made inexpensively.

An encapsulated electrophoretic display can be constructed so that the optical state of the display is stable for some length of time. When the display has two states which are stable in this manner, the display is said to be bistable. If more than two states of the display are stable, then the display can be said to be multistable. For the purpose of this invention, the term bistable will be used to indicate a display in which any optical state remains fixed once the addressing voltage is removed. The definition of a bistable state depends on the application for the display. A slowly-decaying optical state can be effectively bistable if the optical state is substantially unchanged over the required viewing time. For example, in a display which is updated every few minutes, a display image which is stable for hours or days is effectively bistable for that application. In this invention, the term bistable also indicates a display with an optical state sufficiently long-lived as to be effectively bistable for the application in mind. Alternatively, it is possible to construct encapsulated electrophoretic displays in which the image decays quickly once the addressing voltage to the display is removed (i.e., the display is not bistable or multistable). As will be described, in some applications it is advantageous to use an encapsulated electrophoretic display which is not bistable. Whether or not an encapsulated electrophoretic display is bistable, and its degree of bistability, can be controlled through appropriate chemical modification of the electrophoretic particles, the suspending fluid, the capsule, and binder materials.

An encapsulated electrophoretic display may take many forms. The display may comprise capsules dispersed in a binder. The capsules may be of any size or shape. The capsules may, for example, be spherical and may have diameters in the millimeter range or the micron range, but is preferably from ten to a few hundred microns. The capsules may be formed by an encapsulation technique, as described below. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further comprise a suspending fluid in which the particles are dispersed.

The successful construction of an encapsulated electrophoretic display requires the proper interaction of several different types of materials and processes, such as a polymeric binder and, optionally, a capsule membrane. These materials must be chemically compatible with the electrophoretic particles and fluid, as well as with each other. The capsule materials may engage in useful surface interactions with the electrophoretic particles, or may act as a chemical or physical boundary between the fluid and the binder.

In some cases, the encapsulation step of the process is not necessary, and the electrophoretic fluid may be directly dispersed or emulsified into the binder (or a precursor to the binder materials) and an effective "polymer-dispersed electrophoretic display" constructed. In such displays, voids created in the binder may be referred to as capsules or microcapsules even though no capsule membrane is present. The binder dispersed electrophoretic display may be of the emulsion or phase separation type.

Throughout the specification, reference will be made to printing or printed. As used throughout the specification, printing is intended to include all forms of printing and coating, including: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; and other similar techniques. A "printed element" refers to an element formed using any one of the above techniques.

This invention provides novel methods and apparatus for controlling and addressing particle-based displays. Additionally, the invention discloses applications of these methods and materials on flexible substrates, which are useful in large-area, low cost, or high-durability applications.

In one aspect, the present invention relates to an encapsulated electrophoretic display. The display includes a substrate and at least one capsule containing a highly-resistive fluid and a plurality of particles. The display also includes at least two electrodes disposed adjacent the capsule, a potential difference between the electrodes causing some of the particles to migrate toward at least one of the two electrodes. This causes the capsule to change optical properties.

In another aspect, the present invention relates to a colored electrophoretic display. The electrophoretic display includes a substrate and at least one capsule containing a highly-resistive fluid and a plurality of particles. The display also includes colored electrodes. Potential differences are applied to the electrodes in order to control the particles and present a colored display to a viewer.

In yet another aspect, the present invention relates to an electrostatically addressable display comprising a substrate, an encapsulated electrophoretic display adjacent the substrate, and an optional dielectric sheet adjacent the electrophoretic display. Application of an electrostatic charge to the dielectric sheet or display material modulates the appearance of the electrophoretic display.

In still another aspect, the present invention relates to an electrostatically addressable encapsulated display comprising a film and a pair of electrodes. The film includes at least one capsule containing an electrophoretic suspension. The pair of electrodes is attached to either side of the film. Application of an electrostatic charge to the film modulates the optical properties.

In still another aspect, the present invention relates to an electrophoretic display that comprises a conductive substrate, and at least one capsule printed on such substrate. Application of an electrostatic charge to the capsule modulates the optical properties of the display.

In still another aspect the present invention relates to a method for matrix addressing an encapsulated display. The method includes the step of providing three or more electrodes for each display cell and applying a sequence of potentials to the electrodes to control movement of particles within each cell.

In yet another aspect, the present invention relates to a matrix addressed electrophoretic display. The display includes a capsule containing charged particles and three or more electrodes disposed adjacent the capsule. A sequence of voltage potentials is applied to the three or more electrodes causing the charged particles to migrate within the capsule responsive to the sequence of voltage potentials.

In still another aspect, the present invention relates to a rear electrode structure for electrically addressable displays. The structure includes a substrate, a first electrode disposed on a first side of the substrate, and a conductor disposed on a second side of the substrate. The substrate defines at least one conductive via in electrical communication with both the first electrode and the conductor.

BRIEF DESCRIPTION OF THE DRAWINGS

The invention is pointed out with particularity in the appended claims. The advantages of the invention described above, together with further advantages, may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

FIG. 12 is a cross-sectional view of a printed circuit board used as a rear electrode addressing structure.

FIG. 13 is a cross-sectional view of a dielectric sheet used as a rear electrode addressing structure.

FIG. 14 is a cross-sectional view of a rear electrode addressing structure that is formed by printing.

FIG. 15 is a perspective view of an embodiment of a control grid addressing structure.

FIG. 16 is an embodiment of an electrophoretic display that can be addressed using a stylus.

DETAILED DESCRIPTION OF THE INVENTION

Figure 1B:
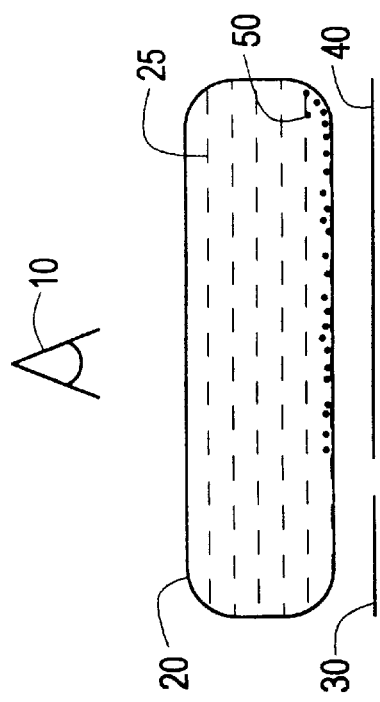
FIG. 1B is a diagrammatic side view of an embodiment of a rear-addressing electrode structure for a particle-based display in which the larger electrode has been placed at a voltage relative to the smaller electrode causing the particles to migrate to the larger electrode.

An electronic ink is an optoelectronically active material which comprises at least two phases: an electrophoretic contrast media phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase is encapsulated, that is, there is a capsule wall phase between the two phases. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate. An electronic ink is capable of being printed by several different processes, depending on the mechanical properties of the specific ink employed. For example, the fragility or viscosity of a particular ink may result in a different process selection. A very viscous ink would not be well-suited to deposition by an inkjet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly(3,4-ethylenedioxythiophene) (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

As an example, there are a class of materials called electroconductive powders which are also useful as coatable transparent conductors in electronic ink displays. One example is Zelec ECP electroconductive powders from DuPont Chemical Co. of Wilmington, Del.

Figure 1A:
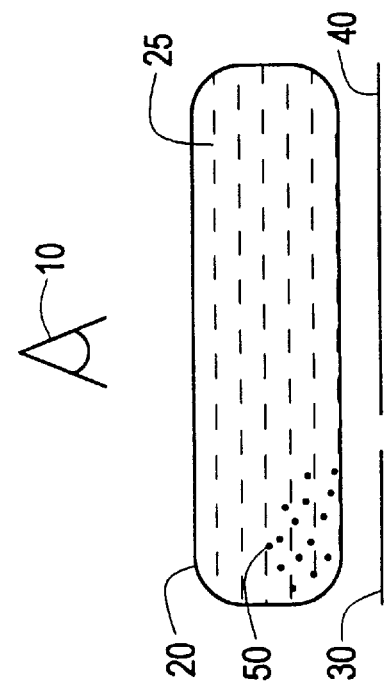
FIG. 1A is a diagrammatic side view of an embodiment of a rear-addressing electrode structure for a particle-based display in which the smaller electrode has been placed at a voltage relative to the large electrode causing the particles to migrate to the smaller electrode.

Referring now to FIGS. 1A and 1B, an addressing scheme for controlling particle-based displays is shown in which electrodes are disposed on only one side of a display, allowing the display to be rear-addressed. Utilizing only one side of the display for electrodes simplifies fabrication of displays. For example, if the electrodes are disposed on only the rear side of a display, both of the electrodes can be fabricated using opaque materials, because the electrodes do not need to be transparent.

FIG. 1A depicts a single capsule 20 of an encapsulated display media. In brief overview, the embodiment depicted in FIG. 1A includes a capsule 20 containing at least one particle 50 dispersed in a suspending fluid 25. The capsule 20 is addressed by a first electrode 30 and a second electrode 40. The first electrode 30 is smaller than the second electrode 40. The first electrode 30 and the second electrode 40 may be set to voltage potentials which affect the position of the particles 50 in the capsule 20.

The particles 50 represent 0.1% to 20% of the volume enclosed by the capsule 20. In some embodiments the particles 50 represent 2.5% to 17.5% of the volume enclosed by capsule 20. In preferred embodiments, the particles 50 represent 5% to 15% of the volume enclosed by the capsule 20. In more preferred embodiments the particles 50 represent 9% to 11% of the volume defined by the capsule 20. In general, the volume percentage of the capsule 20 that the particles 50 represent should be selected so that the particles 50 expose most of the second, larger electrode 40 when positioned over the first, smaller electrode 30. As described in detail below, the particles 50 may be colored any one of a number of colors. The particles 50 may be either positively charged or negatively charged.

The particles 50 are dispersed in a dispersing fluid 25. The dispersing fluid 25 should have a low dielectric constant. The fluid 25 may be clear, or substantially clear, so that the fluid 25 does not inhibit viewing the particles 50 and the electrodes 30, 40 from position 10. In other embodiments, the fluid 25 is dyed. In some embodiments the dispersing fluid 25 has a specific gravity matched to the density of the particles 50. These embodiments can provide a bistable display media, because the particles 50 do not tend to move in certain compositions absent an electric field applied via the electrodes 30, 40.

Figure 1C:
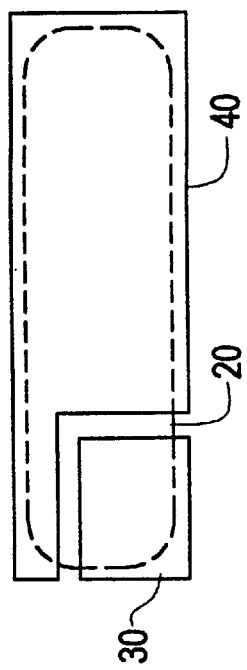
FIG. 1C is a diagrammatic top-down view of one embodiment of a rear-addressing electrode structure.

The electrodes 30, 40 should be sized and positioned appropriately so that together they address the entire capsule 20. There may be exactly one pair of electrodes 30, 40 per capsule 20, multiple pairs of electrodes 30, 40 per capsule 20, or a single pair of electrodes 30, 40 may span multiple capsules 20. In the embodiment shown in FIGS. 1A and 1B, the capsule 20 has a flattened, rectangular shape. In these embodiments, the electrodes 30, 40 should address most, or all, of the flattened surface area adjacent the electrodes 30, 40. The smaller electrode 30 is at most one-half the size of the larger electrode 40. In preferred embodiments the smaller electrode is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40. It should be noted that reference to "smaller" in connection with the electrode 30 means that the electrode 30 addresses a smaller amount of the surface area of the capsule 20, not necessarily that the electrode 30 is physically smaller than the larger electrode 40. For example, multiple capsules 20 may be positioned such that less of each capsule 20 is addressed by the "smaller" electrode 30, even though both electrodes 30, 40 are equal in size. It should also be noted that, as shown in FIG. 1C, electrode 30 may address only a small corner of a rectangular capsule 20 (shown in phantom view in FIG. 1C), requiring the larger electrode 40 to surround the smaller electrode 30 on two sides in order to properly address the capsule 20. Selection of the percentage volume of the particles 50 and the electrodes 30, 40 in this manner allow the encapsulated display media to be addressed as described below.

Electrodes may be fabricated from any material capable of conducting electricity so that electrode 30, 40 may apply an electric field to the capsule 20. As noted above, the rear-addressed embodiments depicted in FIGS. 1A and 1B allow the electrodes 30, 40 to be fabricated from opaque materials such as solder paste, copper, copper-clad polyimide, graphite inks, silver inks and other metal-containing conductive inks. Alternatively, electrodes may be fabricated using transparent materials such as indium tin oxide and conductive polymers such as polyaniline or polythiophenes. Electrodes 30, 40 may be provided with contrasting optical properties. In some embodiments, one of the electrodes has an optical property complementary to optical properties of the particles 50.

In one embodiment, the capsule 20 contains positively charged black particles 50, and a substantially clear suspending fluid 25. The first, smaller electrode 30 is colored black, and is smaller than the second electrode 40, which is colored white or is highly reflective. When the smaller, black electrode 30 is placed at a negative voltage potential relative to larger, white electrode 40, the positively-charged particles 50 migrate to the smaller, black electrode 30. The effect to a viewer of the capsule 20 located at position is a mixture of the larger, white electrode 40 and the smaller, black electrode 30, creating an effect which is largely white. Referring to FIG. 1B, when the smaller, black electrode 30 is placed at a positive voltage potential relative to the larger, white electrode 40, particles 50 migrate to the larger, white electrode 40 and the viewer is presented a mixture of the black particles 50 covering the larger, white electrode 40 and the smaller, black electrode 30, creating an effect which is largely black. In this manner the capsule 20 may be addressed to display either a white visual state or a black visual state.

Other two-color schemes are easily provided by varying the color of the smaller electrode 30 and the particles 50 or by varying the color of the larger electrode 40. For example, varying the color of the larger electrode 40 allows fabrication of a rear-addressed, two-color display having black as one of the colors. Alternatively, varying the color of the smaller electrode 30 and the particles 50 allow a rear-addressed two-color system to be fabricated having white as one of the colors. Further, it is contemplated that the particles 50 and the smaller electrode 30 can be different colors. In these embodiments, a two-color display may be fabricated having a second color that is different from the color of the smaller electrode 30 and the particles 50. For example, a rear-addressed, orange-white display may be fabricated by providing blue particles 50, a red, smaller electrode 30, and a white (or highly reflective) larger electrode 40. In general, the optical properties of the electrodes 30, 40 and the particles 50 can be independently selected to provide desired display characteristics. In some embodiments the optical properties of the dispersing fluid 25 may also be varied, e.g. the fluid 25 may be dyed.

Figure 2A:
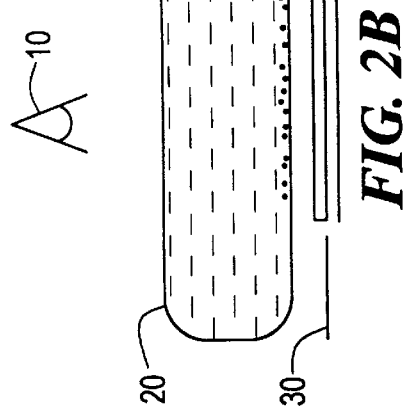
FIG. 2A is a diagrammatic side view of an embodiment of a rear-addressing electrode structure having a retroreflective layer associated with the larger electrode in which the smaller electrode has been placed at a voltage relative to the large electrode causing the particles to migrate to the smaller electrode.
Figure 2B:
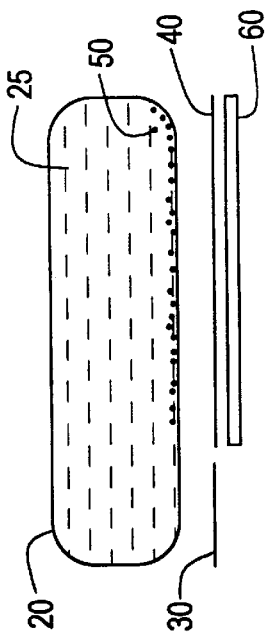
FIG. 2B is a diagrammatic side view of an embodiment of a rear-addressing electrode structure having a retroreflective layer associated with the larger electrode in which the larger electrode has been placed at a voltage relative to the smaller electrode causing the particles to migrate to the larger electrode.
Figure 2C:
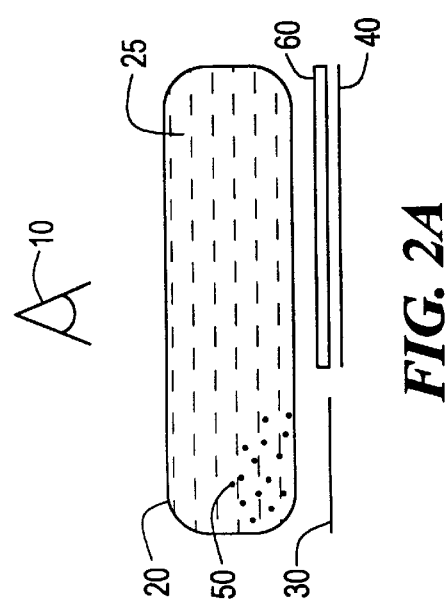
FIG. 2C is a diagrammatic side view of an embodiment of a rear-addressing electrode structure having a retroreflective layer disposed below the larger electrode in which the smaller electrode has been placed at a voltage relative to the large electrode causing the particles to migrate to the smaller electrode.
Figure 2D:
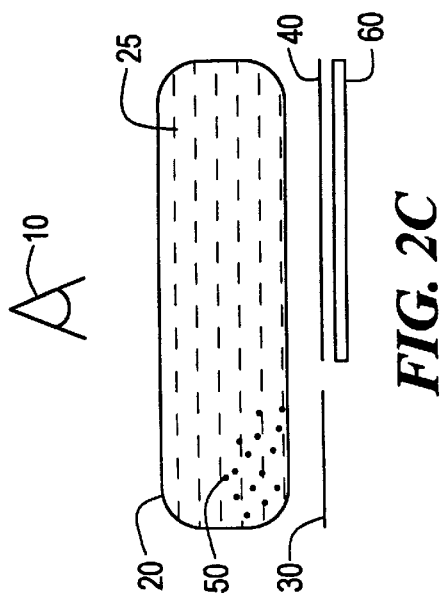
FIG. 2D is a diagrammatic side view of an embodiment of a rear-addressing electrode structure having a retroreflective layer disposed below the larger electrode in which the larger electrode has been placed at a voltage relative to the smaller electrode causing the particles to migrate to the larger electrode.

In other embodiments the larger electrode 40 may be reflective instead of white. In these embodiments, when the particles 50 are moved to the smaller electrode 30, light reflects off the reflective surface 60 associated with the larger electrode 40 and the capsule 20 appears light in color, e.g. white (see FIG. 2A). When the particles 50 are moved to the larger electrode 40, the reflecting surface 60 is obscured and the capsule 20 appears dark (see FIG. 2B) because light is absorbed by the particles 50 before reaching the reflecting surface 60. The reflecting surface 60 for the larger electrode 40 may possess retroflective properties, specular reflection properties, diffuse reflective properties or gain reflection properties. In certain embodiments, the reflective surface 60 reflects light with a Lambertian distribution The surface 60 may be provided as a plurality of glass spheres disposed on the electrode 40, a diffractive reflecting layer such as a holographically formed reflector, a surface patterned to totally internally reflect incident light, a brightness-enhancing film, a diffuse reflecting layer, an embossed plastic or metal film, or any other known reflecting surface. The reflecting surface 60 may be provided as a separate layer laminated onto the larger electrode 40 or the reflecting surface 60 may be provided as a unitary part of the larger electrode 40. In the embodiments depicted by FIGS. 2C and 2D, the reflecting surface may be disposed below the electrodes 30, 40 vis-a-vis the viewpoint 10. In these embodiments, electrode 30 should be transparent so that light may be reflected by surface 60. In other embodiments, proper switching of the particles may be accomplished with a combination of alternating-current (AC) and direct-current (DC) electric fields and described below in connection with FIGS. 3A–3D.

In still other embodiments, the rear-addressed display previously discussed can be configured to transition between largely transmissive and largely opaque modes of operation (referred to hereafter as "shutter mode"). Referring back to FIGS. 1A and 1B, in these embodiments the capsule 20 contains at least one positively-charged particle 50 dispersed in a substantially clear dispersing fluid 25. The larger electrode 40 is transparent and the smaller electrode 30 is opaque. When the smaller, opaque electrode 30 is placed at a negative voltage potential relative to the larger, transmissive electrode 40, the particles 50 migrate to the smaller, opaque electrode 30. The effect to a viewer of the capsule 20 located at position 10 is a mixture of the larger, transparent electrode 40 and the smaller, opaque electrode 30, creating an effect which is largely transparent. Referring to FIG. 1B, when the smaller, opaque electrode 30 is placed at a positive voltage potential relative to the larger, transparent electrode 40, particles 50 migrate to the second electrode 40 and the viewer is presented a mixture of the opaque particles 50 covering the larger, transparent electrode 40 and the smaller, opaque electrode 30, creating an effect which is largely opaque. In this manner, a display formed using the capsules depicted in FIGS. 1A and 1B may be switched between transmissive and opaque modes. Such a display can be used to construct a window that can be rendered opaque. Although FIGS. 1A–2D depict a pair of electrodes associated with each capsule 20, it should be understood that each pair of electrodes may be associated with more than one capsule 20.

Figure 3B:
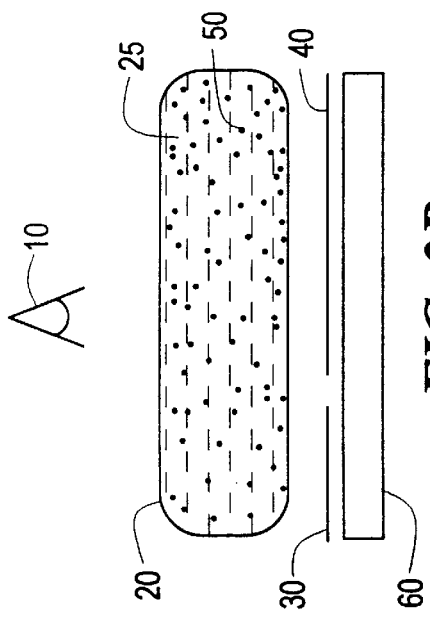
FIG. 3B is a diagrammatic side view of an embodiment of an addressing structure in which an alternating-current electric field has been applied to the capsule causing the particles to disperse into the capsule.
Figure 3D:
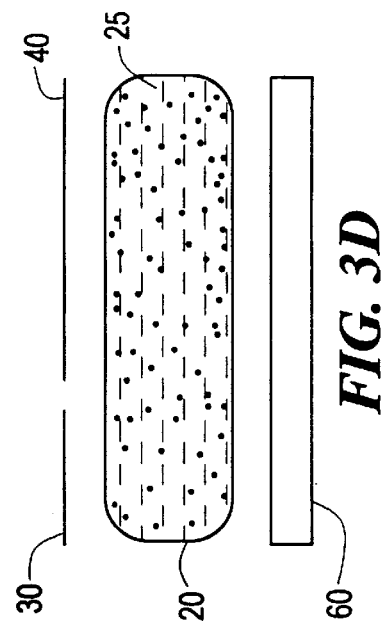
FIG. 3D is a diagrammatic side view of an embodiment of an addressing structure having transparent electrodes, in which an alternating-current electric field has been applied to the capsule causing the particles to disperse into the capsule.
Figure 3A:
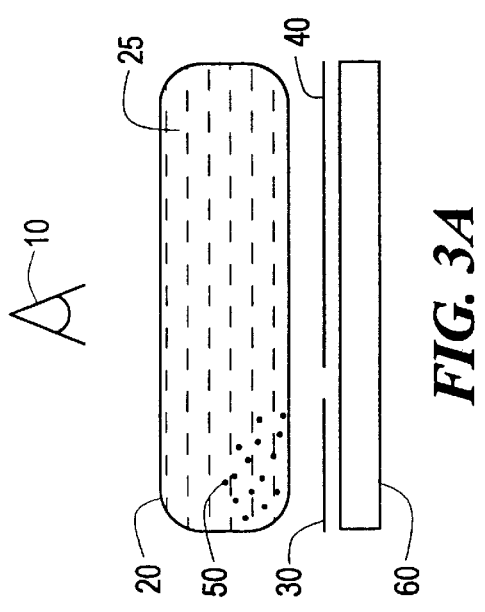
FIG. 3A is a diagrammatic side view of an embodiment of an addressing structure in which a direct-current electric field has been applied to the capsule causing the particles to migrate to the smaller electrode.

A similar technique may be used in connection with the embodiment of FIGS. 3A, 3B, 3C, and 3D. Referring to FIG. 3A, a capsule 20 contains at least one dark or black particle 50 dispersed in a substantially clear dispersing fluid 25. A smaller, opaque electrode 30 and a larger, transparent electrode 40 apply both direct-current (DC) electric fields and alternating-current (AC) fields to the capsule 20. A DC field can be applied to the capsule 20 to cause the particles 50 to migrate towards the smaller electrode 30. For example, if the particles 50 are positively charged, the smaller electrode is placed a voltage that is more negative than the larger electrode 40. Although FIGS. 3A–3D depict only one capsule per electrode pair, multiple capsules may be addressed using the same electrode pair.

The smaller electrode 30 is at most one-half the size of the larger electrode 40. In preferred embodiments the smaller electrode is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40.

Causing the particles 50 to migrate to the smaller electrode 30, as depicted in FIG. 3A, allows incident light to pass through the larger, transparent electrode 40 and be reflected by a reflecting surface 60. In shutter mode, the reflecting surface 60 is replaced by a translucent layer, a transparent layer, or a layer is not provided at all, and incident light is allowed to pass through the capsule 20, i.e. the capsule 20 is transmissive.

Referring now to FIG. 3B, the particles 50 are dispersed into the capsule 20 by applying an AC field to the capsule 20 via the electrodes 30, 40. The particles 50, dispersed into the capsule 20 by the AC field, block incident light from passing through the capsule 20, causing it to appear dark at the viewpoint 10. The embodiment depicted in FIGS. 3A–3B may be used in shutter mode by not providing the reflecting surface 60 and instead providing a translucent layer, a transparent layer, or no layer at all. In shutter mode, application of an AC electric field causes the capsule 20 to appear opaque. The transparency of a shutter mode display formed by the apparatus depicted in FIGS. 3A–3D may be controlled by the number of capsules addressed using DC fields and AC fields. For example, a display in which every other capsule 20 is addressed using an AC field would appear fifty percent transmissive.

Figure 3C:
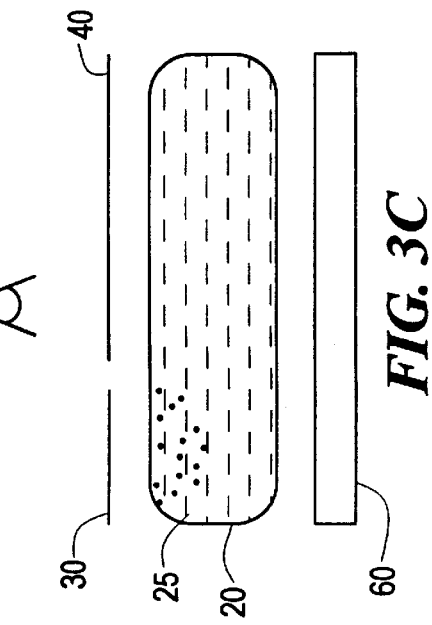
FIG. 3C is a diagrammatic side view of an embodiment of an addressing structure having transparent electrodes, in which a direct-current electric field has been applied to the capsule causing the particles to migrate to the smaller electrode.

FIGS. 3C and 3D depict an embodiment of the electrode structure described above in which electrodes 30, 40 are on "top" of the capsule 20, that is, the electrodes 30, 40 are between the viewpoint 10 and the capsule 20. In these embodiments, both electrodes 30, 40 should be transparent. Transparent polymers can be fabricated using conductive polymers, such as polyaniline, polythiophenes, or indium tin oxide. These materials may be made soluble so that electrodes can be fabricated using coating techniques such as spin coating, spray coating, meniscus coating, printing techniques, forward and reverse roll coating and the like. In these embodiments, light passes through the electrodes 30, 40 and is either absorbed by the particles 50, reflected by retroreflecting layer 60 (when provided), or transmitted throughout the capsule 20 (when retroreflecting layer 60 is not provided).

The addressing structure depicted in FIGS. 3A–3D may be used with electrophoretic display media and encapsulated electrophoretic display media. FIGS. 3A–3D depict embodiments in which electrode 30, 40 are statically attached to the display media. In certain embodiments, the particles 50 exhibit bistability, that is, they are substantially motionless in the absence of a electric field. In these embodiments, the electrodes 30, 40 may be provided as part of a "stylus" or other device which is scanned over the material to address each capsule or cluster of capsules. This mode of addressing particle-based displays will be described in more detail below in connection with FIG. 16.

Figure 4A:
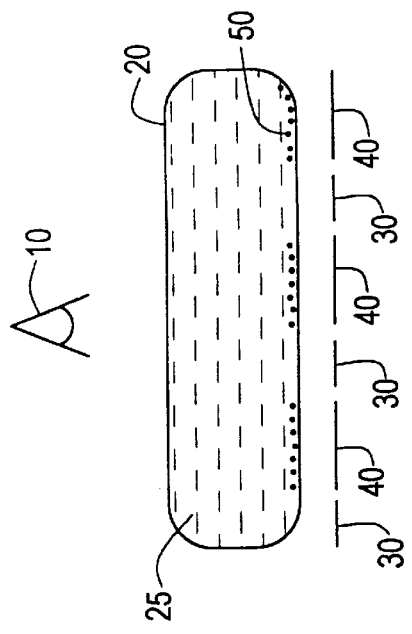
FIG. 4A is a diagrammatic side view of an embodiment of a rear-addressing electrode structure for a particle-based display in which multiple smaller electrodes have been placed at a voltage relative to multiple larger electrodes, causing the particles to migrate to the smaller electrodes.
Figure 4B:
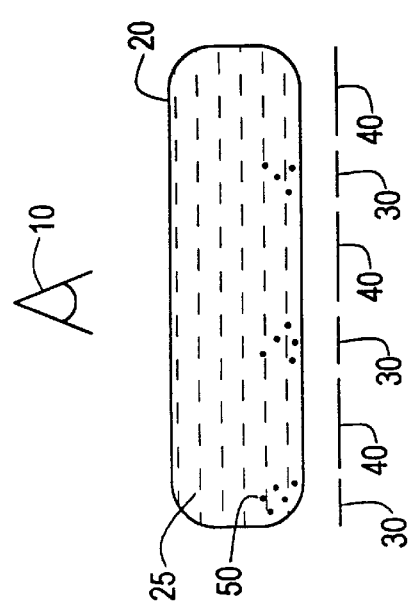
FIG. 4B is a diagrammatic side view of an embodiment of a rear-addressing electrode structure for a particle-based display in which multiple larger electrodes have been placed at a voltage relative to multiple smaller electrodes, causing the particles to migrate to the larger electrodes.

Referring now to FIGS. 4A and 4B, a capsule 20 of a electronically addressable media is illustrated in which the technique illustrated above is used with multiple rear-addressing electrodes. The capsule 20 contains at least one particle 50 dispersed in a clear suspending fluid 25. The capsule 20 is addressed by multiple smaller electrodes 30 and multiple larger electrodes 40. In these embodiments, the smaller electrodes 30 should be selected to collectively be at most one-half the size of the larger electrodes 40. In further embodiments, the smaller electrodes 30 are collectively one-fourth the size of the larger electrodes 40. In further embodiments the smaller electrodes 30 are collectively one-eighth the size of the larger electrodes 40. In preferred embodiments, the smaller electrodes 30 are collectively one-sixteenth the size of the larger electrodes. Each electrode 30 may be provided as separate electrodes that are controlled in parallel to control the display. For example, each separate electrode may be substantially simultaneously set to the same voltage as all other electrodes of that size. Alternatively, the electrodes 30, 40 may be interdigitated to provide the embodiment shown in FIGS. 4A and 4B.

Operation of the rear-addressing electrode structure depicted in FIGS. 4A and 4B is similar to that described above. For example, the capsule 20 may contain positively charged, black particles 50 dispersed in a substantially clear suspending fluid 25. The smaller electrodes 30 are colored black and the larger electrodes 40 are colored white or are highly reflective. Referring to FIG. 4A, the smaller electrodes 30 are placed at a negative potential relative to the larger electrodes 40, causing particles 50 migrate within the capsule to the smaller electrodes 30 and the capsule 20 appears to the viewpoint 10 as a mix of the larger, white electrodes 40 and the smaller, black electrodes 30, creating an effect which is largely white. Referring to FIG. 4B, when the smaller electrodes 30 are placed at a positive potential relative to the larger electrodes 40, particles 50 migrate to the larger electrodes 40 causing the capsule 20 to display a mix of the larger, white electrodes 40 occluded by the black particles 50 and the smaller, black electrodes 30, creating an effect which is largely black. The techniques described above with respect to the embodiments depicted in FIGS. 1A and 1B for producing two-color displays work with equal effectiveness in connection with these embodiments.

Figure 5A:
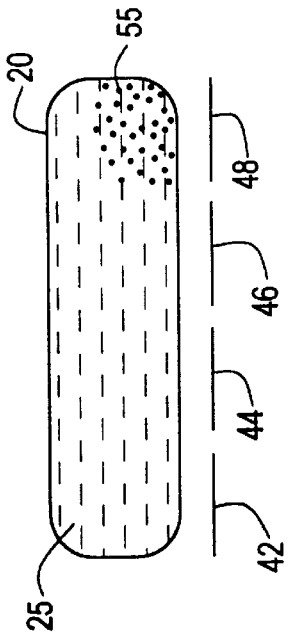
FIG. 5A is a diagrammatic side view of an embodiment of a rear-addressing electrode structure for a particle-based display having colored electrodes and a white electrode, in which the colored electrodes have been placed at a voltage relative to the white electrode causing the particles to migrate to the colored electrodes.
Figure 5B:
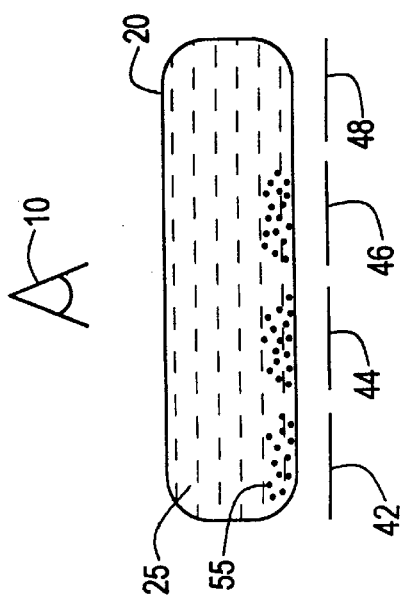
FIG. 5B is a diagrammatic side view of an embodiment of a rear-addressing electrode structure for a particle-based display having colored electrodes and a white electrode, in which the white electrode has been placed at a voltage relative to the colored electrodes causing the particles to migrate to the white electrode.

FIGS. 5A and 5B depict an embodiment of a rear-addressing electrode structure that creates a reflective color display in a manner similar to halftoning or pointillism. The capsule 20 contains white particles 55 dispersed in a clear suspending fluid 25. Electrodes 42, 44, 46, 48 are colored cyan, magenta, yellow, and white respectively. Referring to FIG. 5A, when the colored electrodes 42, 44, 46 are placed at a positive potential relative to the white electrode 48, negatively-charged particles 55 migrate to these three electrodes, causing the capsule 20 to present to the viewpoint 10 a mix of the white particles 55 and the white electrode 48, creating an effect which is largely white. Referring to FIG. 5B, when electrodes 42, 44, 46 are placed at a negative potential relative to electrode 48, particles 55 migrate to the white electrode 48, and the eye 10 sees a mix of the white particles 55, the cyan electrode 42, the magenta electrode 44, and the yellow electrode 46, creating an effect which is largely black or gray. By addressing the electrodes, any color can be produced that is possible with a subtractive color process. For example, to cause the capsule 20 to display an orange color to the viewpoint 10, the yellow electrode 46 and the magenta electrode 42 are set to a voltage potential that is more positive than the voltage potential applied by the cyan electrode 42 and the white electrode 48. Further, the relative intensities of these colors can be controlled by the actual voltage potentials applied to the electrodes.

Figure 6:
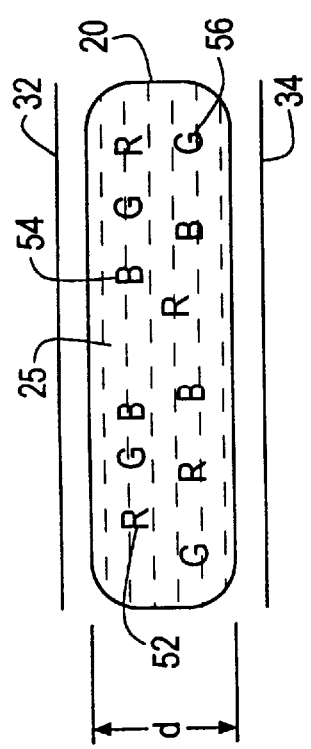
FIG. 6 is a diagrammatic side view of an embodiment of a color display element having red, green, and blue particles of different electrophoretic mobilities.

In another embodiment, depicted in FIG. 6, a color display is provided by a capsule 20 of size d containing multiple species of particles in a clear, dispersing fluid 25. Each species of particles has different optical properties and possess different electrophoretic mobilities ($\mu$) from the other species. In the embodiment depicted in FIG. 6, the capsule 20 contains red particles 52, blue particles 54, and green particles 56, and $$|\mu_R| > |\mu_B| > |\mu_G|$$

That is, the magnitude of the electrophoretic mobility of the red particles 52, on average, exceeds the electrophoretic mobility of the blue particles 54, on average, and the electrophoretic mobility of the blue particles 54, on average, exceeds the average electrophoretic mobility of the green particles 56. As an example, there may be a species of red particle with a zeta potential of 100 millivolts (mV), a blue particle with a zeta potential of 60 mV, and a green particle with a zeta potential of 20 mV. The capsule 20 is placed between two electrodes 32, 42 that apply an electric field to the capsule.

Figure 7A:
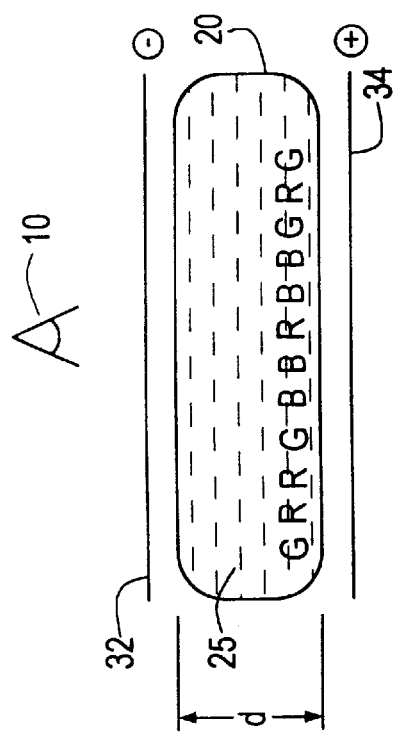
FIGS. 7A–7B depict the steps taken to address the display of FIG. 6 to display red.
Figure 7B:
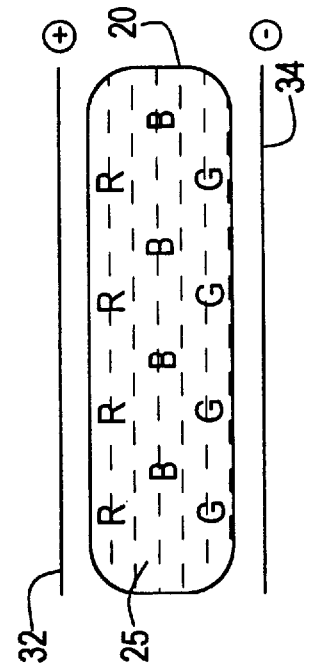

FIGS. 7A–7B depict the steps to be taken to address the display shown in FIG. 6 to display a red color to a viewpoint 10. Referring to FIG. 7A, all the particles 52, 54, 56 are attracted to one side of the capsule 20 by applying an electric field in one direction. The electric field should be applied to the capsule 20 long enough to attract even the more slowly moving green particles 56 to the electrode 34. Referring to FIG. 7B, the electric field is reversed just long enough to allow the red particles 52 to migrate towards the electrode 32. The blue particles 54 and green particles 56 will also move in the reversed electric field, but they will not move as fast as the red particles 52 and thus will be obscured by the red particles 52. The amount of time for which the applied electric field must be reversed can be determined from the relative electrophoretic mobilities of the particles, the strength of the applied electric field, and the size of the capsule.

Figure 8B:
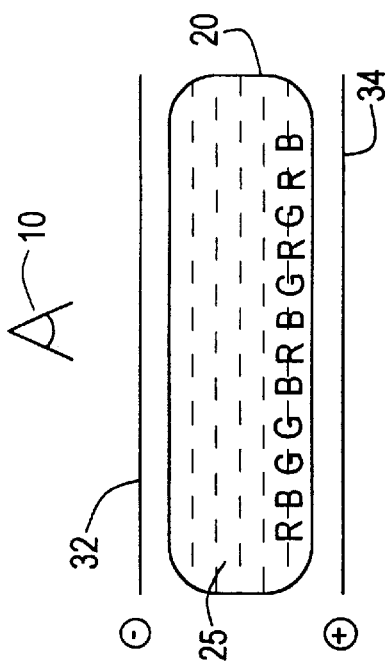
FIGS. 8A–8D depict the steps taken to address the display of FIG. 6 to display blue.
Figure 8D:
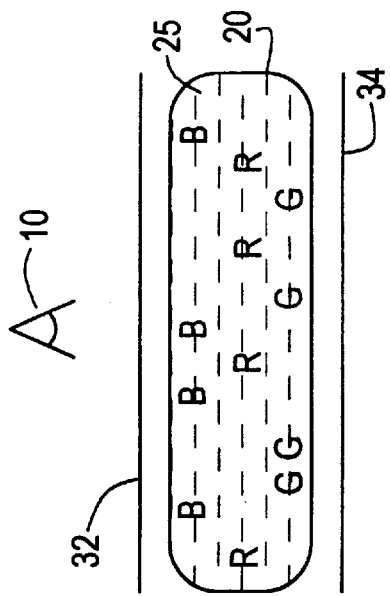
Figure 8A:
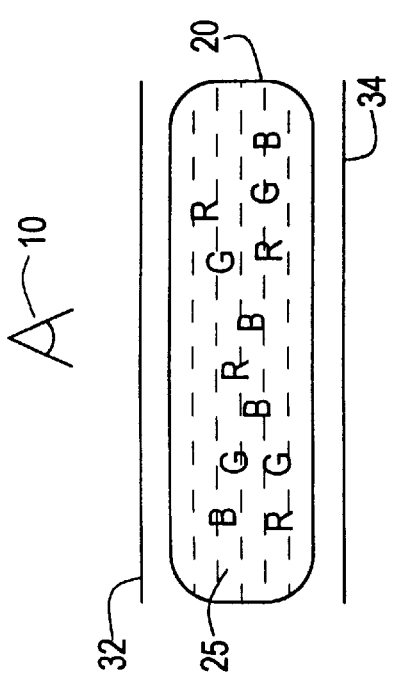
Figure 8C:
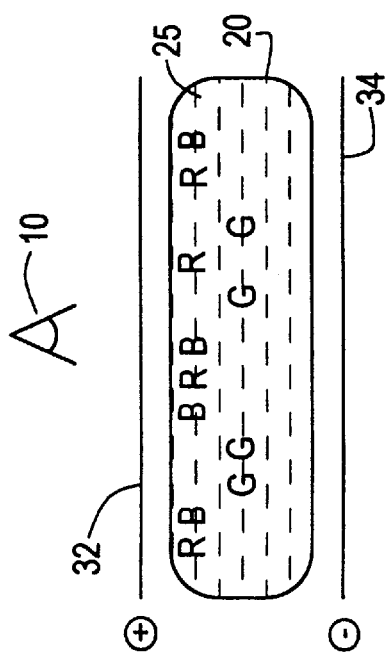

FIGS. 8A–8D depict addressing the display element to a blue state. As shown in FIG. 8A, the particles 52, 54, 56 are initially randomly dispersed in the capsule 20. All the particles 52, 54, 56 are attracted to one side of the capsule 20 by applying an electric field in one direction (shown in FIG. 8B). Referring to FIG. 8C, the electric field is reversed just long enough to allow the red particles 52 and blue particles 54 to migrate towards the electrode 32. The amount of time for which the applied electric field must be reversed can be determined from the relative electrophoretic mobilities of the particles, the strength of the applied electric field, and the size of the capsule. Referring to FIG. 8D, the electric field is then reversed a second time and the red particles 52, moving faster than the blue particles 54, leave the blue particles 54 exposed to the viewpoint 10. The amount of time for which the applied electric field must be reversed can be determined from the relative electrophoretic mobilities of the particles, the strength of the applied electric field, and the size of the capsule.

Figure 9A:
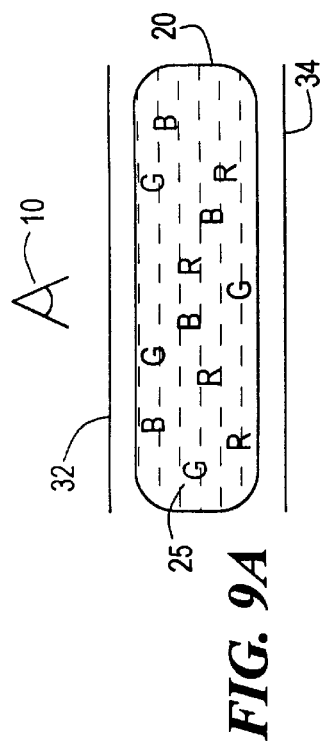
FIGS. 9A–9C depict the steps taken to address the display of FIG. 6 to display green.
Figure 9B:
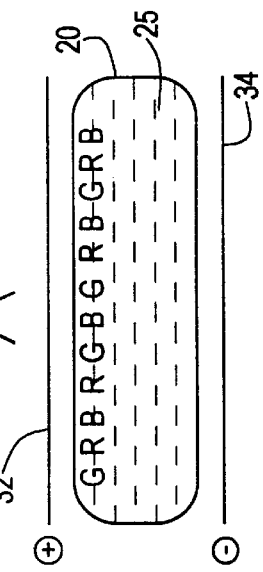
Figure 9C:
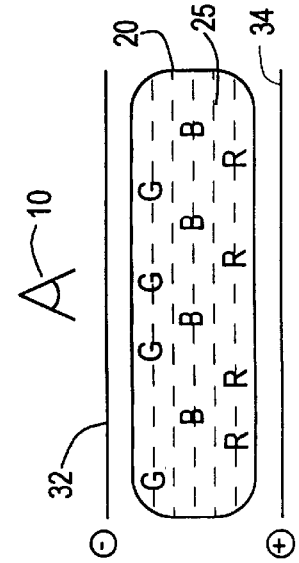

FIGS. 9A–9C depict the steps to be taken to present a green display to the viewpoint 10. As shown in FIG. 9A, the particles 52, 54, 56 are initially distributed randomly in the capsule 20. All the particles 52, 54, 56 are attracted to the side of the capsule 20 proximal the viewpoint 10 by applying an electric field in one direction. The electric field should be applied to the capsule 20 long enough to attract even the more slowly moving green particles 56 to the electrode 32. As shown in FIG. 9C, the electric field is reversed just long enough to allow the red particles 52 and the blue particles 54 to migrate towards the electrode 54, leaving the slowly-moving green particles 56 displayed to the viewpoint. The amount of time for which the applied electric field must be reversed can be determined from the relative electrophoretic mobilities of the particles, the strength of the applied electric field, and the size of the capsule.

In other embodiments, the capsule contains multiple species of particles and a dyed dispersing fluid that acts as one of the colors. In still other embodiments, more than three species of particles may be provided having additional colors. Although FIGS. 6–9C depict two electrodes associated with a single capsule, the electrodes may address multiple capsules or less than a full capsule.

Figure 10:
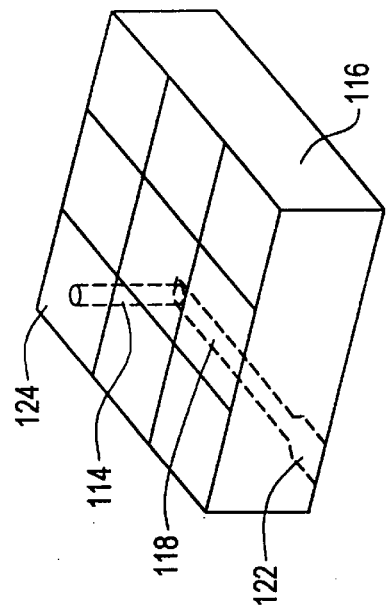
FIG. 10 is a perspective embodiment of a rear electrode structure for addressing a seven segment display.

In FIG. 10, the rear substrate 100 for a seven segment display is shown that improves on normal rear electrode structures by providing a means for arbitrarily connecting to any electrode section on the rear of the display without the need for conductive trace lines on the surface of the patterned substrate or a patterned counter electrode on the front of the display. Small conductive vias through the substrate allow connections to the rear electrode structure. On the back of the substrate, these vias are connected to a network of conductors. This conductors can be run so as to provide a simple connection to the entire display. For example, segment 112 is connected by via 114 through the substrate 116 to conductor 118. A network of conductors may run multiple connections (not shown) to edge connector 122. This connector can be built into the structure of the conductor such as edge connector 122. Each segment of the rear electrode can be individually addressed easily through edge connector 122. A continuous top electrode can be used with the substrate 116.

The rear electrode structure depicted in FIG. 10 is useful for any display media, but is particularly advantageous for particle-based displays because such displays do not have a defined appearance when not addressed. The rear electrode should be completely covered in an electrically conducting material with room only to provide necessary insulation of the various electrodes. This is so that the connections on the rear of the display can be routed with out concern for affecting the appearance of the display. Having a mostly continuous rear electrode pattern assures that the display material is shielded from the rear electrode wire routing.

Figure 11:
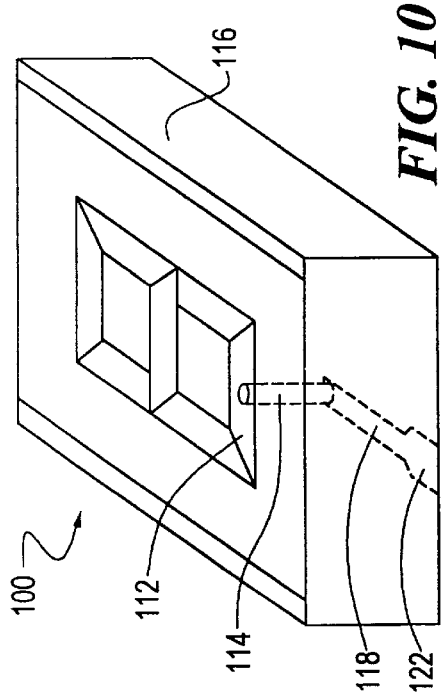
FIG. 11 is a perspective embodiment of a rear electrode structure for addressing a three by three matrix display element.

In FIG. 11, a 3×3 matrix is shown. Here, matrix segment 124 on a first side of substrate 116 is connected by via 114 to conductor 118 on a second side of substrate 116. The conductors 18 run to an edge and terminate in a edge connector 122. Although the display element of FIG. 11 shows square segments 124, the segments may be shaped or sized to form a predefined display pattern.

In FIG. 12, a printed circuit board 138 is used as the rear electrode structure. The front of the printed circuit board 138 has copper pads 132 etched in the desired shape. There are plated vias 114 connecting these electrode pads to an etched wire structure 136 on the rear of the printed circuit board 138. The wires 136 can be run to one side or the rear of the printed circuit board 138 and a connection can be made using a standard connector such as a surface mount connector or using a flex connector and anisotropic glue (not shown). Vias may be filled with a conductive substance, such as solder or conductive epoxy, or an insulating substance, such as epoxy.

Alternatively, a flex circuit such a copper-clad polyimide may be used for the rear electrode structure of FIG. 10. Printed circuit board 138 may be made of polyimide, which acts both as the flex connector and as the substrate for the electrode structure. Rather than copper pads 132, electrodes (not shown) may be etched into the copper covering the polyimide printed circuit board 138. The plated through vias 114 connect the electrodes etched onto the substrate the rear of the printed circuit board 138, which may have an etched conductor network thereon (the etched conductor network is similar to the etched wire structure 136).

In FIG. 13, a thin dielectric sheet 150, such as polyester, polyimide, or glass can be used to make a rear electrode structure. Holes 152 are punched, drilled, abraded, or melted through the sheet where conductive paths are desired. The front electrode 154 is made of conductive ink printed using any technique described above. The holes should be sized and the ink should be selected to have a viscosity so that the ink fills the holes. When the back structure 156 is printed, again using conductive ink, the holes are again filled. By this method, the connection between the front and back of the substrate is made automatically.

In FIG. 14, the rear electrode structure can be made entirely of printed layers. A conductive layer 166 can be printed onto the back of a display comprised of a clear, front electrode 168 and a printable display material 170. A clear electrode may be fabricated from indium tin oxide or conductive polymers such as polyanilines and polythiophenes. A dielectric coating 176 can be printed leaving areas for vias. Then, the back layer of conductive ink 178 can be printed. If necessary, an additional layer of conductive ink can be used before the final ink structure is printed to fill in the holes.

This technique for printing displays can be used to build the rear electrode structure on a display or to construct two separate layers that are laminated together to form the display. For example an electronically active ink may be printed on an indium tin oxide electrode. Separately, a rear electrode structure as described above can be printed on a suitable substrate, such as plastic, polymer films, or glass. The electrode structure and the display element can be laminated to form a display.

Referring now to FIG. 15, a threshold may be introduced into an electrophoretic display cell by the introduction of a third electrode. One side of the cell is a continuous, transparent electrode 200 (anode). On the other side of the cell, the transparent electrode is patterned into a set of isolated column electrode strips 210. An insulator 212 covers the column electrodes 210, and an electrode layer on top of the insulator is divided into a set of isolated row electrode strips 230, which are oriented orthogonal to the column electrodes 210. The row electrodes 230 are patterned into a dense array of holes, or a grid, beneath which the exposed insulator 212 has been removed, forming a multiplicity of physical and potential wells.

A positively charged particle 50 is loaded into the potential wells by applying a positive potential (e.g. 30V) to all the column electrodes 210 while keeping the row electrodes 230 at a less positive potential (e.g. 15V) and the anode 200 at zero volts. The particle 50 may be a conformable capsule that situates itself into the physical wells of the control grid. The control grid itself may have a rectangular cross-section, or the grid structure may be triangular in profile. It can also be a different shape which encourages the microcapsules to situate in the grid, for example, hemispherical.

The anode 200 is then reset to a positive potential (e.g. 50V). The particle will remain in the potential wells due to the potential difference in the potential wells: this is called the Hold condition. To address a display element the potential on the column electrode associated with that element is reduced, e.g. by a factor of two, and the potential on the row electrode associated with that element is made equal to or greater than the potential on the column electrode. The particles in this element will then be transported by the electric field due to the positive voltage on the anode 200. The potential difference between row and column electrodes for the remaining display elements is now less than half of that in the normal Hold condition. The geometry of the potential well structure and voltage levels are chosen such that this also constitutes a Hold condition, i.e., no particles will leave these other display elements and hence there will be no half-select problems. This addressing method can select and write any desired element in a matrix without affecting the pigment in any other display element. A control electrode device can be operated such that the anode electrode side of the cell is viewed.

The control grid may be manufactured through any of the processes known in the art, or by several novel processes described herein. That is, according to traditional practices, the control grid may be constructed with one or more steps of photolithography and subsequent etching, or the control grid may be fabricated with a mask and a "sandblasting" technique.

In another embodiment, the control grid is fabricated by an embossing technique on a plastic substrate. The grid electrodes may be deposited by vacuum deposition or sputtering, either before or after the embossing step. In another embodiment, the electrodes are printed onto the grid structure after it is formed, the electrodes consisting of some kind of printable conductive material which need not be clear (e.g. a metal or carbon-doped polymer, an intrinsically conducting polymer, etc.).

In a preferred embodiment, the control grid is fabricated with a series of printing steps. The grid structure is built up in a series of one or more printed layers after the cathode has been deposited, and the grid electrode is printed onto the grid structure. There may be additional insulator on top of the grid electrode, and there may be multiple grid electrodes separated by insulator in the grid structure. The grid electrode may not occupy the entire width of the grid structure, and may only occupy a central region of the structure, in order to stay within reproducible tolerances. In another embodiment, the control grid is fabricated by photoetching away a glass, such as a photostructural glass.

In an encapsulated electrophoretic image display, an electrophoretic suspension, such as the ones described previously, is placed inside discrete compartments that are dispersed in a polymer matrix. This resulting material is highly susceptible to an electric field across the thickness of the film. Such a field is normally applied using electrodes attached to either side of the material. However, as described above in connection with FIGS. 3A–3D, some display media may be addressed by writing electrostatic charge onto one side of the display material. The other side normally has a clear or opaque electrode. For example, a sheet of encapsulated electrophoretic display media can be addressed with a head providing DC voltages.

In another implementation, the encapsulated electrophoretic suspension can be printed onto an area of a conductive material such as a printed silver or graphite ink, aluminized mylar, or any other conductive surface. This surface which constitutes one electrode of the display can be set at ground or high voltage. An electrostatic head consisting of many electrodes can be passed over the capsules to address them. Alternatively, a stylus can be used to address the encapsulated electrophoretic suspension.

In another implementation, an electrostatic write head is passed over the surface of the material. This allows very high resolution addressing. Since encapsulated electrophoretic material can be placed on plastic, it is flexible. This allows the material to be passed through normal paper handling equipment. Such a system works much like a photocopier, but with no consumables. The sheet of display material passes through the machine and an electrostatic or electrophotographic head addresses the sheet of material.

In another implementation, electrical charge is built up on the surface of the encapsulated display material or on a dielectric sheet through frictional or triboelectric charging. The charge can built up using an electrode that is later removed. In another implementation, charge is built up on the surface of the encapsulated display by using a sheet of piezoelectric material.

FIG. 16 shows an electrostatically written display. Stylus 300 is connected to a positive or negative voltage. The head of the stylus 300 can be insulated to protect the user. Dielectric layer 302 can be, for example, a dielectric coating or a film of polymer. In other embodiments, dielectric layer 302 is not provided and the stylus 300 contacts the encapsulated electrophoretic display 304 directly. Substrate 306 is coated with a clear conductive coating such as ITO coated polyester. The conductive coating is connected to ground. The display 304 may be viewed from either side.

Microencapsulated displays offer a useful means of creating electronic displays, many of which can be coated or printed. There are many versions of microencapsulated displays, including microencapsulated electrophoretic displays. These displays can be made to be highly reflective, bistable, and low power.

To obtain high resolution displays, it is useful to use some external addressing means with the microencapsulated material. This invention describes useful combinations of addressing means with microencapsulated electrophoretic materials in order to obtain high resolution displays.

One method of addressing liquid crystal displays is the use of silicon-based thin film transistors to form an addressing backplane for the liquid crystal. For liquid crystal displays, these thin film transistors are typically deposited on glass, and are typically made from amorphous silicon or polysilicon. Other electronic circuits (such as drive electronics or logic) are sometimes integrated into the periphery of the display. An emerging field is the deposition of amorphous or polysilicon devices onto flexible substrates such as metal foils or plastic films.

The addressing electronic backplane could incorporate diodes as the nonlinear element, rather than transistors. Diode-based active matrix arrays have been demonstrated as being compatible with liquid crystal displays to form high resolution devices.

There are also examples of crystalline silicon transistors being used on glass substrates. Crystalline silicon possesses very high mobilities, and thus can be used to make high performance devices. Presently, the most straightforward way of constructing crystalline silicon devices is on a silicon wafer. For use in many types of liquid crystal displays, the crystalline silicon circuit is constructed on a silicon wafer, and then transferred to a glass substrate by a "liftoff" process. Alternatively, the silicon transistors can be formed on a silicon wafer, removed via a liftoff process, and then deposited on a flexible substrate such as plastic, metal foil, or paper. As another implementation, the silicon could be formed on a different substrate that is able to tolerate high temperatures (such as glass or metal foils), lifted off, and transferred to a flexible substrate. As yet another implementation, the silicon transistors are formed on a silicon wafer, which is then used in whole or in part as one of the substrates for the display.

The use of silicon-based circuits with liquid crystals is the basis of a large industry. Nevertheless, these display possess serious drawbacks. Liquid crystal displays are inefficient with light, so that most liquid crystal displays require some sort of backlighting. Reflective liquid crystal displays can be constructed, but are typically very dim, due to the presence of polarizers. Most liquid crystal devices require precise spacing of the cell gap, so that they are not very compatible with flexible substrates. Most liquid crystal displays require a "rubbing" process to align the liquid crystals, which is both difficult to control and has the potential for damaging the TFT array.

The combination of these thin film transistors with microencapsulated electrophoretic displays should be even more advantageous than with liquid crystal displays. Thin film transistor arrays similar to those used with liquid crystals could also be used with the microencapsulated display medium. As noted above, liquid crystal arrays typically requires a "rubbing" process to align the liquid crystals, which can cause either mechanical or static electrical damage to the transistor array. No such rubbing is needed for microencapsulated displays, improving yields and simplifying the construction process.

Microencapsulated electrophoretic displays can be highly reflective. This provides an advantage in high-resolution displays, as a backlight is not required for good visibility. Also, a high-resolution display can be built on opaque substrates, which opens up a range of new materials for the deposition of thin film transistor arrays.

Moreover, the encapsulated electrophoretic display is highly compatible with flexible substrates. This enables high-resolution TFT displays in which the transistors are deposited on flexible substrates like flexible glass, plastics, or metal foils. The flexible substrate used with any type of thin film transistor or other nonlinear element need not be a single sheet of glass, plastic, metal foil, though. Instead, it could be constructed of paper. Alternatively, it could be constructed of a woven material. Alternatively, it could be a composite or layered combination of these materials.

As in liquid crystal displays, external logic or drive circuitry can be built on the same substrate as the thin film transistor switches.

In another implementation, the addressing electronic backplane could incorporate diodes as the nonlinear element, rather than transistors.

In another implementation, it is possible to form transistors on a silicon wafer, dice the transistors, and place them in a large area array to form a large, TFT-addressed display medium. One example of this concept is to form mechanical impressions in the receiving substrate, and then cover the substrate with a slurry or other form of the transistors. With agitation, the transistors will fall into the impressions, where they can be bonded and incorporated into the device circuitry. The receiving substrate could be glass, plastic, or other nonconductive material. In this way, the economy of creating transistors using standard processing methods can be used to create large-area displays without the need for large area silicon processing equipment.

While the examples described here are listed using encapsulated electrophoretic displays, there are other particle-based display media which should also work as well, including encapsulated suspended particles and rotating ball displays.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An electrostatically addressable encapsulated electrophoretic image display comprising:

a film including at least one capsule containing an electrophoretic suspension, said at least one capsule dispersed in a binder, one side of said film providing a viewing surface through which said display can be viewed; and at least one pair of electrodes, each of said at least one pair of electrodes disposed adjacent said film, said electrodes comprising printable conductive ink, both of said pair of electrodes disposed on the opposed side of said film from said viewing surface;

wherein application of electrostatic charge to said film modulates the optical qualities of said electrophoretic systems.

2. The display of claim 1 wherein both of said pair of electrodes are opaque.

3. The display of claim 2 wherein at least one of said pair of electrodes comprises a material selected from the group consisting of metallic ink and graphite ink.

4. An electrostatically addressable encapsulated electrophoretic image display comprising:

a film including at least one capsule containing an electrophoretic suspension, said at least one capsule dispersed in a binder, one side of said film providing a viewing surface through which said display can be viewed; and at least one pair of electrodes, said electrodes comprising printable conductive ink, one of said at least one pair of electrodes comprising a clear electrode disposed adjacent said viewing surface of said film, said clear electrode comprising a material selected from the group consisting of semiconducting colloids, organic conductors and electroconductive powders, and a second of said at least one pair of electrodes disposed adjacent the opposed side of said film from said viewing surface;

wherein application of electrostatic charge to said film modulates the optical qualities of said electrophoretic systems.

5. The display of claim 4, wherein said clear electrode comprises a material selected from the group consisting of indium tin oxide, antimony-doped tin oxide, polyanilines, polythiophenes, poly(3,4-ethylenedioxythiophene), polypyrroles, polyphenylenevinylenes, and conductive derivatives of naphthalene, phthalocyanine and pentacene.

6. An electrostatically addressable encapsulated electrophoretic image display comprising:

a film including at least one capsule containing an electrophoretic suspension, said at least one capsule dispersed in a binder, one side of said film providing a viewing surface through which said display can be viewed; and at least one pair of electrodes, said electrodes comprising printable conductive ink, one of said at least one pair of electrodes comprising a clear electrode disposed adjacent said viewing surface of said film, and a second of said at least one pair of electrodes disposed adjacent the opposed side of said film from said viewing surface, wherein said second electrode is opaque and comprises a material selected from the group consisting of metallic ink and graphite ink;

wherein application of electrostatic charge to said film modulates the optical qualities of said electrophoretic systems.

7. An electrostatically addressable encapsulated electrophoretic image display comprising:

a film including at least one capsule containing an electrophoretic suspension, said at least one capsule dispersed in a binder, wherein one side of said film provides a viewing surface through which said display can be viewed; and at least one pair of electrodes, each of said at least one pair of electrodes disposed adjacent said film, said electrodes comprising printable conductive ink, wherein both said pair of electrodes are clear and are disposed adjacent said viewing surface;

wherein application of electrostatic charge to said film modulates the optical qualities of said electrophoretic systems.

8. The display of claim 7 wherein said clear electrodes comprise a material selected from the group consisting of semiconducting colloids, organic conductors and electroconductive powders.

9. The display of claim 8 wherein said clear electrodes comprise a material selected from the group consisting of indium tin oxide, antimony-doped tin oxide, polyanilines, polythiophenes, poly(3,4-ethylenedioxythiophene), polypyrroles, polyphenylenevinylenes, and conductive derivatives of naphthalene, phthalocyanine and pentacene.

10. An electrostatically addressable, encapsulated electrophoretic image display comprising:

a film including at least one capsule containing an electrophoretic suspension, said at least one capsule dispersed in a binder; and a clear electrode disposed adjacent a first side of said film, said electrode comprising a printable substance, said clear electrode comprising a material selected from the group consisting of semiconducting colloids, organic conductors and electroconductive powders;

wherein an electrostatic charge applied to a second side of said film modulates the optical qualities of said electrophoretic suspension.

11. The display of claim 10 wherein said clear electrode comprises a material selected from the group consisting of indium tin oxide, antimony-doped tin oxide, polyanilines, polythiophenes, poly(3,4-ethylenedioxythiophene), polypyrroles, polyphenylenevinylenes, and conductive derivatives of naphthalene, phthalocyanine and pentacene.

12. An electrostatically addressable, encapsulated electrophoretic image display comprising:

a film including at least one capsule containing an electrophoretic suspension, said at least one capsule dispersed in a binder;

a clear electrode disposed adjacent a first side of said film, said electrode comprising a printable substance; and an opaque electrode adjacent the opposed side of said film from said clear electrode, said opaque electrode comprising a material selected from the group consisting of metallic ink and graphite ink;

wherein an electrostatic charge applied to a second side of said film modulates the optical qualities of said electrophoretic suspension.

13. The display of claim 6, wherein said metallic ink comprises a silver-bearing ink.

14. The display of claim 12, wherein said metallic ink comprises a silver-bearing ink.

15. The display of claim 12, wherein said clear electrode comprising a printable substance comprises a material selected from the group consisting of indium tin oxide, antimony-doped tin oxide, polyanilines, polythiophenes, poly(3,4-ethylenedioxythiophene), polypyrroles, polyphenylenevinylenes, and conductive derivatives of naphthalene, phthalocyanine and pentacene.

* * * * *